(12) United States Patent
Farooq et al.

(10) Patent No.: US 6,228,682 B1
(45) Date of Patent: May 8, 2001

(54) MULTI-CAVITY SUBSTRATE STRUCTURE FOR DISCRETE DEVICES

(75) Inventors: Mukta S. Farooq; John U. Knickerbocker, both of Hopewell Junction; Srinivasa S. Reddy, Lagrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,157

(22) Filed: Dec. 21, 1999

(51) Int. Cl.[7] ............................ H01L 21/44; H01L 21/48; H01L 21/50
(52) U.S. Cl. ............................. 438/110; 438/22; 438/612
(58) Field of Search .................................. 438/106, 110, 438/22, 42, 612, 613

(56) References Cited

U.S. PATENT DOCUMENTS 5,210,683   5/1993   Ley .
5,746,874 * 5/1998   Natarajan et al. .
5,831,810  11/1998   Bird et al. .

* cited by examiner

Primary Examiner—Kevin M. Picardat
Assistant Examiner—D. M. Collins
(74) Attorney, Agent, or Firm—DeLio & Peterson, LLC; Peter W. Peterson; Jay H. Anderson

(57) ABSTRACT

The distance between a discrete or passive electrical component and an electrical semiconductor device and substrate or carrier is minimized by shortening the lead length connections of the passive component. One or more passive electronic components are mounted within the body of a carrier or board by creating a cavity in the substrate or carrier that is directly below a semiconductor device. The passive component is electrically connected to the substrate and device using solder bump technology resulting in much shorter lead length connections to and from the passive component.

9 Claims, 4 Drawing Sheets

MULTI-CAVITY SUBSTRATE STRUCTURE FOR DISCRETE DEVICES

BACKGROUND OF THE INVENTION

1. Field of the Invention

The present invention relates generally to integrated circuit packaging, and in particular to a structure and method for minimizing the lead length between a passive electronic device and an integrated circuit.

2. Description of Related Art

Semiconductor devices having high and dense lead counts and operating at high speeds require very short leads to ensure noiseless signal propagation. Noise can be introduced onto a lead by other nearby signal leads. Additionally, passive devices or components, such as resistors, capacitors, inductors and filters, add to the length of signal leads within an assembly. As used herein, the term "semiconductor device" or "device" refers to an integrated circuit chip or die containing circuitry. The "carrier" refers to the substrate material upon which the device is attached and contains internal circuitry that is used to interface the device with other electronic components. The "semiconductor device assembly" or "assembly" refers to the semiconductor device plus associated carrier containing the device. The "passive" refers to resistors, inductors, filters, capacitors and any combination attached to the carrier and/or device as a component of the assembly. A "board" is a structure that is used to hold a plurality of carriers.

The lead length effect is highly affected by the capacitor type passive component. It is highly desirable to locate the capacitors as close to the semiconductor device as possible. It is a common practice to mount capacitors external to the semiconductor device. In some carriers, the capacitors may be mounted on the same plane as the device but off to one side or another. Another carrier structure might attach the capacitor within a socket or cavity on the carrier. In either case, the capacitor is "remotely" located away from the semiconductor device. As the distance from the capacitor to the semiconductor device increases, the capacitor's efficiency and effectiveness are adversely affected. Problems that can occur include stray inductances, ground plane bounce, and voltage surges.

Attempts in the prior art to reduce lead lengths has not resolved these problems. For example, U.S. Pat. No. 5,210,683 discloses an assembly for mounting a capacitor, external to a semiconductor device, within a well or cavity that is formed in the assembly in close proximity to the device such that it is located within the assembly and thereby somewhat reducing the lead or via length. However, the major problem of connectivity to the device, without electrical noise still exists with this structure.

Bearing in mind the problems and deficiencies of the prior art, it is therefore an object of the present invention to provide a structure and method for minimizing the lead length between a passive electronic component, a carrier or board, and an electronic device.

It is another object of the present invention to provide a structure and method to minimize the distance between a passive electronic device and a semiconductor device.

A further object of the invention is to provide a method and structure to minimize the length of signal leads within a semiconductor device assembly.

It is yet another object of the present invention to provide a method and structure to minimize the ability of electrical noise to be induced onto nearby signal leads.

Still other objects and advantages of the invention will in part be obvious and will in part be apparent from the specification.

SUMMARY OF THE INVENTION

The above and other objects and advantages, which will be apparent to one skilled in the art, are achieved in the present invention which is directed to, in a first aspect, a method of electrically connecting a passive electronic component to a semiconductor substrate and a semiconductor device whereby the lead lengths between the passive electrical component, the substrate and the device are minimized. In the preferred embodiment, the method comprises forming a first cavity in a layer of a semiconductor substrate. The first cavity has at least one electrical termination pad on one of its surfaces. A first passive electrical component is electrically connected in the first cavity, the electrical connection being made between at least one electrical connection point on a surface of the first component and the electrical termination pad of the cavity. A semiconductor device is placed over the first cavity and first component such that an electrical termination pad on the semiconductor device makes an electrical connection with a second connection point on the first component.

In the preferred embodiment, a second cavity having at least one electrical termination pad is also formed in the substrate and a second passive electrical component is electrically connected to an electrical connection point in the second cavity. In the most preferred embodiment, a number of cavities are formed in the substrate surface, each one being adapted to have a passive electrical component mounted therein with an electrical connection being made between termination pads in the cavity and electrical connection points on the component.

In the preferred embodiment, the electrical connection points on the passive component are solder bumps and the electrical connections are made using controlled collapse chip connection technology. In the most preferred embodiment, the electrical connection points are located on opposing sides of the component.

In another aspect, the method may include forming a multilevel cavity adapted to hold a plurality of passive electrical components.

In the preferred embodiment, the substrate includes a plurality of layers including at least one layer of internal circuitry used to interface the passive components with at least one other electrical device. It is also preferred that the method include electrically connecting the substrate to at least one passive electrical component mounted in a cavity formed in an electronic circuit board.

In another aspect, the present invention is directed to a structure for electrically connecting a discrete electrical component between a semiconductor substrate and an electronic semiconductor device whereby the lead length of the discrete electrical device is minimized. The structure comprises at least one cavity formed in a semiconductor substrate, and at least one discrete electrical component located in the cavity. The electronic component is electrically connected to the substrate and a semiconductor device positioned over the cavity. In the preferred embodiment, the cavity includes at least one electrical termination pad on a surface of the cavity which is electrically connected to an electrical connection point on the electrical component. In the preferred embodiment, the electrical connection points on the component are located on opposing sides of the component. It is preferred that the electrical connection points are solder bumps.

In the preferred embodiment, the component is electrically connected to the substrate and the semiconductor device, most preferably using solder connection technology. It is also preferred that the solder connection technology is controlled collapse connection technology.

The cavity may also comprise a multilevel cavity adapted to contain a plurality of discrete components electrically connected to the substrate semiconductor device. In the preferred embodiment, the substrate layer includes at least one layer of internal circuitry used to interface the discrete electrical component with at least one other electrical device. In the preferred embodiment, the electronic circuit board may have at least one cavity formed therein adapted to contain at least one discrete electrical component electrically connected to the circuit board and the substrate.

BRIEF DESCRIPTION OF THE DRAWING

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT

Figure 1:
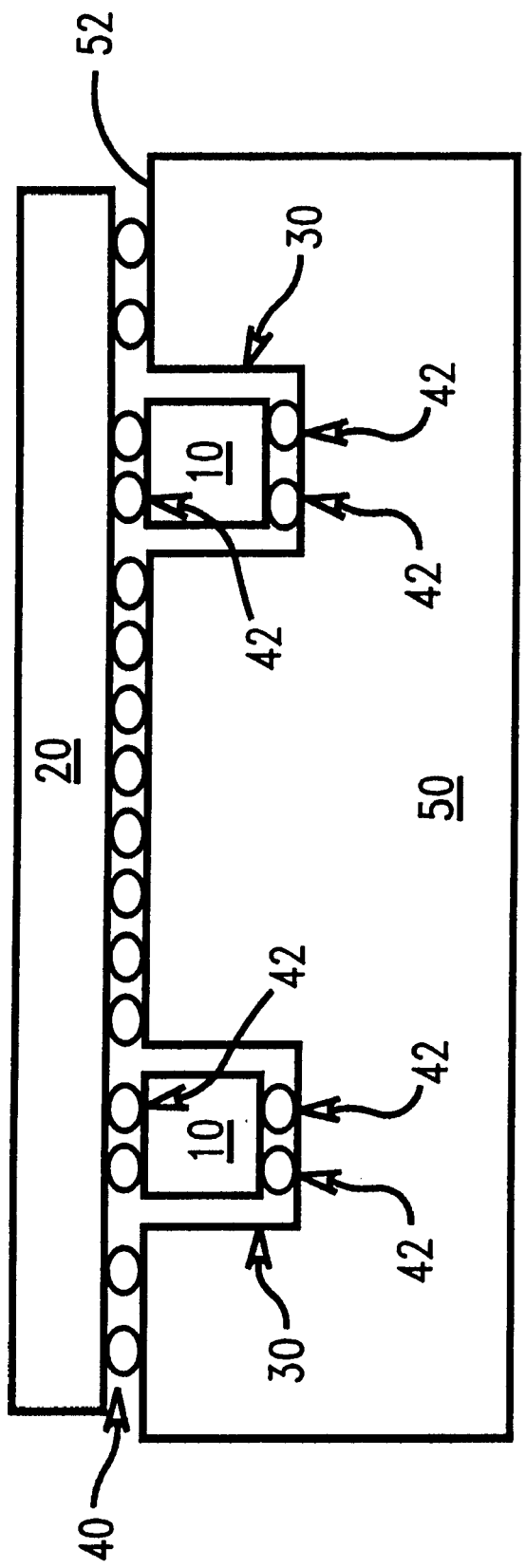
FIG. 1 is an elevational view of a semiconductor structure of the present invention having two cavities for passive electronic components.

In describing the preferred embodiment of the present invention, reference will be made herein to FIGS. 1–4 of the drawings in which like numerals refer to like features of the invention. Features of the invention are not necessarily shown to scale in the drawings.

Figure 2:
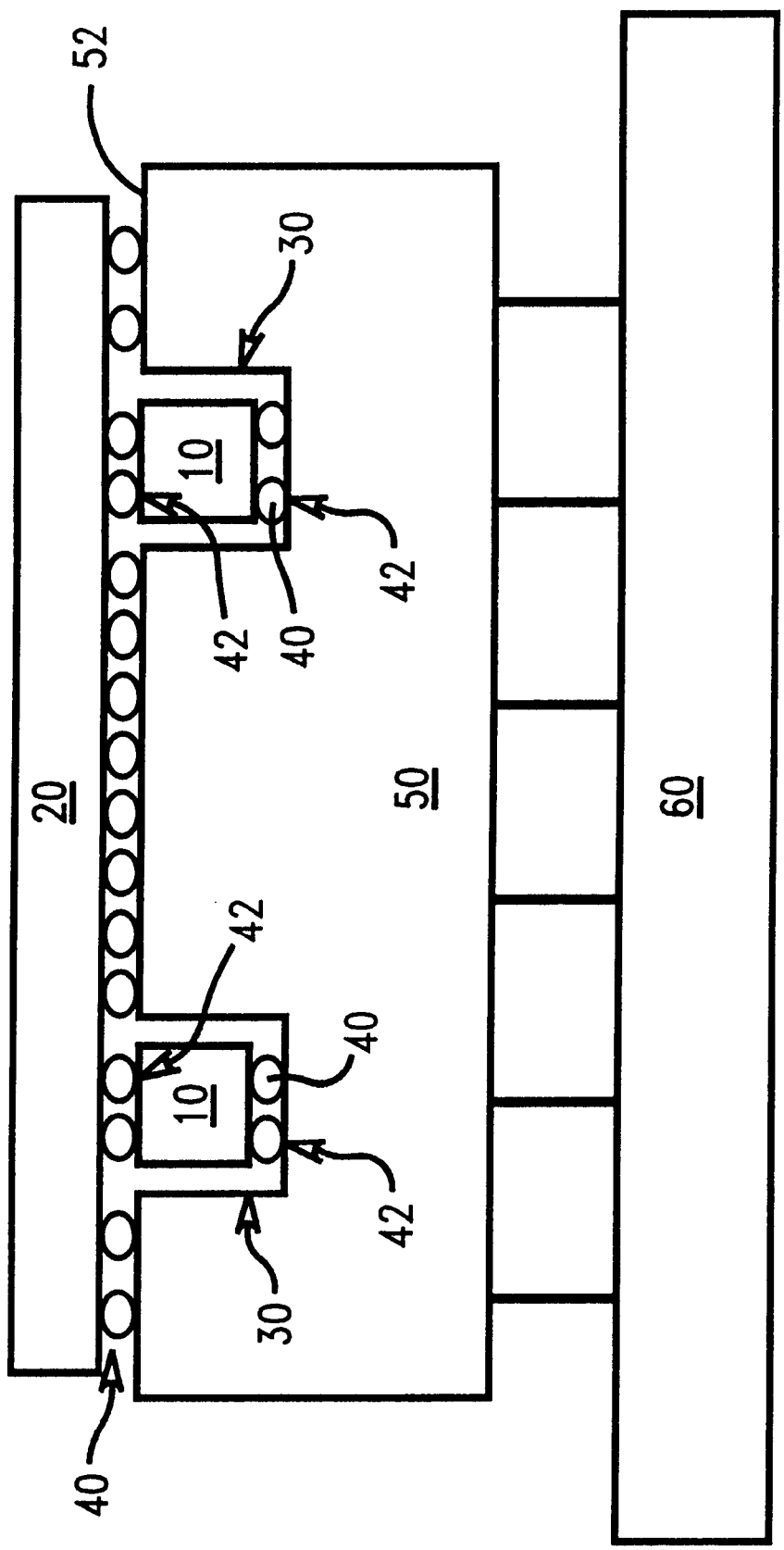
FIG. 2 is an elevational view of a semiconductor structure of the present invention attached to a semiconductor circuit board.
Figure 3:
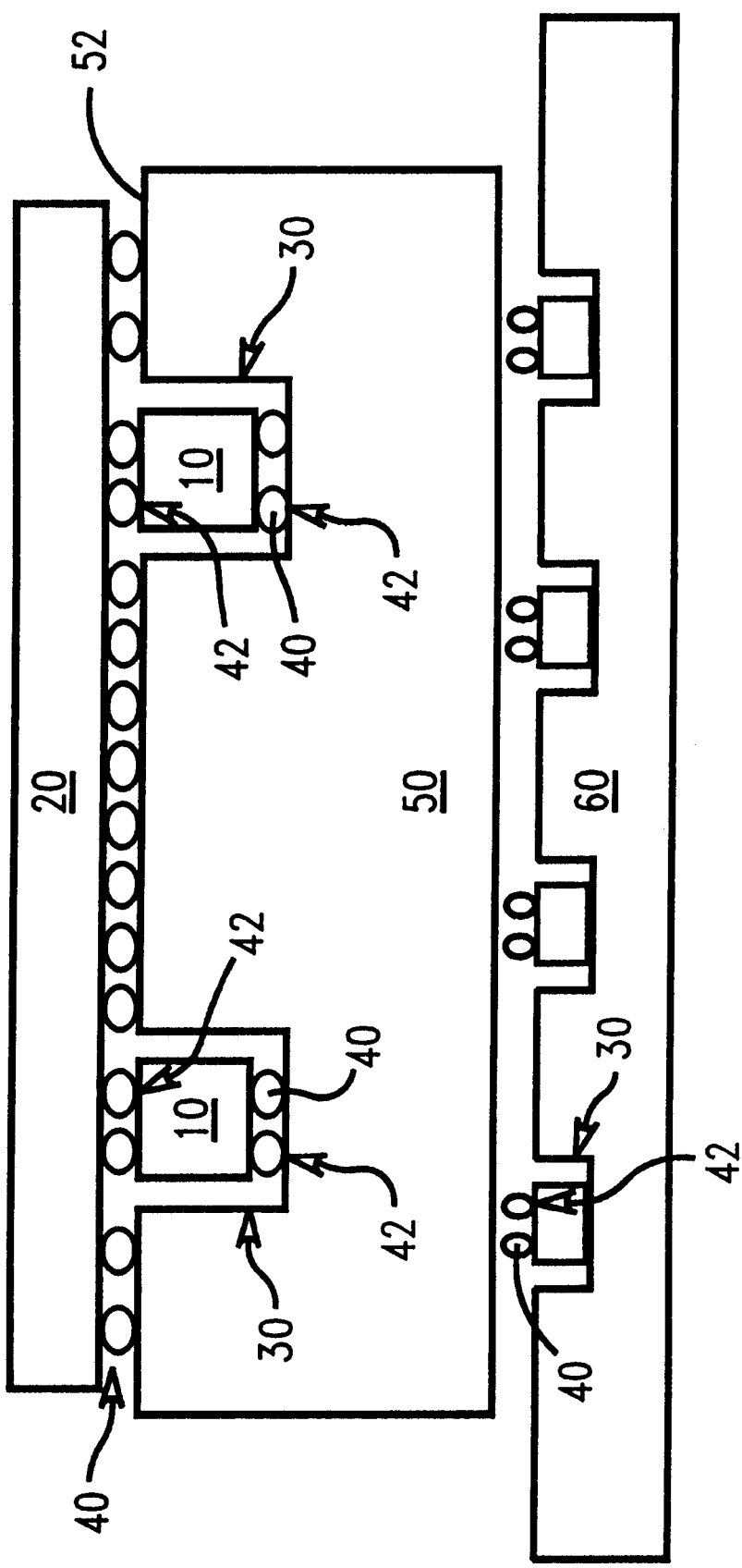
FIG. 3 is an elevational view of the semiconductor structure of the present invention having a plurality of cavities for passive electronic components and attachment to a semiconductor circuit board.
Figure 4:
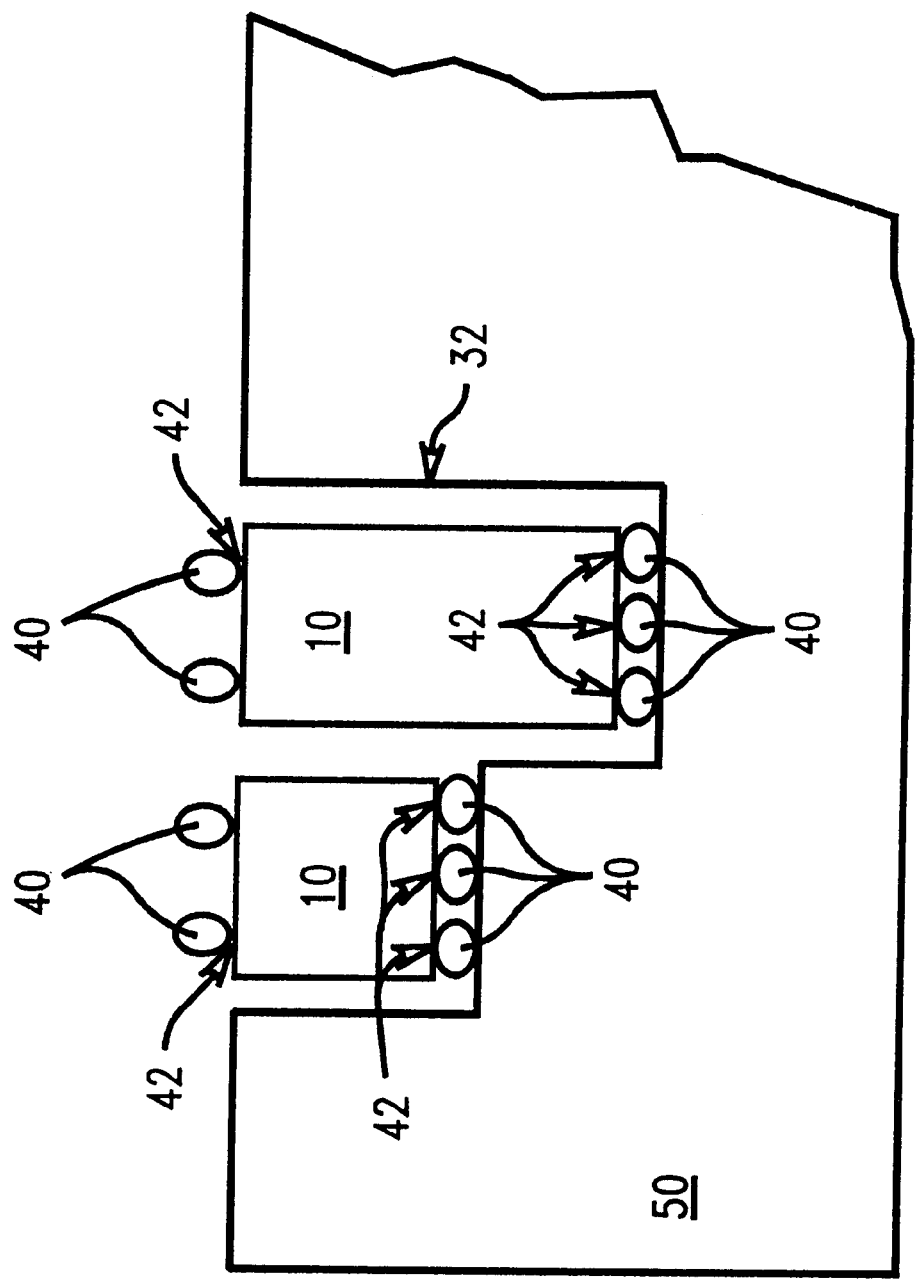
FIG. 4 is an elevational view of a multi-level cavity structure of the present invention.

In the present invention, one or more passive electronic components 10 are mounted within the body of a carrier or board 50 by creating a cavity 30 in a substrate or carrier 50 that is directly below a semiconductor device 20 and electrically contacting substrate 50 and device 20 to component 10, as shown in FIG. 1. This results in a much shorter lead length for the passive component 10. A typical carrier 50 includes a plurality of layers including internal wiring including vias, power planes and transmission lines. Carrier 50 may comprise ceramic, glass, organic, silicon materials or any commonly known semiconductor device carrier structure. Carrier 50 with passive components 10 and device 20 may be attached to an integrated circuit board 60, as shown in FIG. 2. Circuit board 60 may also comprise a plurality of cavities 30 containing an electrically connected passive component 10 and is electrically connected to carrier 50 as shown in FIG. 3.

As shown in FIG. 1, the structure of the present invention comprises carrier 50 having a plurality of cavities 30 formed in the carrier plane 52. Passive component 10 is mounted in cavity 30 and electrically connected to carrier 50. Device 20, such as an integrated circuit chip package is electrically connected to carrier 50 and passive component 10. Electrical connection points 40 may be used to connect passive component 10 to carrier 50 and device 20.

In the preferred embodiment, passive component 10 has at least two electrical connection points 40, which may or may not be on opposing sides of faces of the component. In the most preferred embodiment, passive component 10 has electrical connection points 40 on opposing sides of the component. Connection point 40 allows for electrical connection of passive component 10 to corresponding connection points on carrier 50 and device 20. The connection between passive component 10 and carrier 50 can be made with any one of a wide variety of known connection technologies such as solder, C4, LGA-C4, LGA-CGA, C4-wirebond, LGA, wirebond, or conductive polymer. In the preferred embodiment, the electrical connection of passive component 10 to carrier 50 is made using controlled collapse chip connection technology, such as "C4" solder bumps, formed by known techniques.

Semiconductor device 20 is any commonly known integrated circuit device having C4 metallization or electrical termination pads which allows electrical connection of device 20 to passive component 10 and carrier 50 and correspond to the location of connection point 40.

The shape of cavity 30 may be cubic, cuboid, or multilevel. In a multilevel cavity 32, shown in FIG. 4, two or more passives 10 may be attached and connected. Cavity 30 may have electrical connection or "termination" pads 42 on any sidewall of the cavity, including the bottom. The location and number of the termination pads is design dependent, but corresponds to the location of connection points 40.

Cavity 30 may be formed by any known process. Examples include: insert process, sub-lamination process or laser drilling. For organic carriers, a reactive ion etch process may be used. For ceramic carriers a punching process may be used.

The process for attachment of passive component 10 to carrier 50 is performed using any standard attachment technique. Examples include: (1) pre-soldering the carrier or cavity; loading the passive components followed by a standard solder reflow join cycle; (2) use of conductive polymer in cavity and curing; or (3) use of "fuzz button" technology.

Device 20 is attached to passive component 10 and carrier 50 using standard techniques including solder, C4 or wirebond.

The present invention also allows for passive redundancy designs and the use of standard testing methods to test the passives before attaching the chip. If necessary, a standard rework process may be used to replace the defective passive prior to attaching the chip.

Thus, by mounting passive component 10 in cavity 30 directly underneath device 20, the present invention provides a structure and method to electrically connect passive electronic components to a semiconductor assembly, including a carrier and an integrated circuit board, while minimizing the lead distance between a board or carrier to the passive component as well as to the device. The shortened lead lengths reduce the amount of electrical noise induced onto adjacent signal leads and increases the passive component's performance and effectiveness.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of electrically connecting a passive electronic component to a semiconductor substrate and a semiconductor device whereby the lead lengths between said passive electrical component, said substrate and said device are minimized, the method comprising the steps of:

provide a layer of a semiconductor substrate;

forming a first cavity in said layer, said first cavity having at least one electrical termination pad on a surface of said first cavity;

placing a first passive electrical component in said first cavity, said first component having at least one electrical connection point on a surface of said first component, said first component being positioned in said first cavity such that the location of a first connection point on said first component corresponds to the location of a first termination pad of said first cavity;

placing said semiconductor device over said first cavity and said first component such that an electrical termination pad on said semiconductor device corresponds to the location of a second connection point on said first component;

electrically connecting said first component to said substrate and said semiconductor device.

2. The method of claim 1 further comprising the step, after the step of placing said first component in said first cavity, of:

forming a second cavity in said substrate, said second cavity having at least one electrical termination pad on a surface of said second cavity;

placing a second passive electrical component in said second cavity, said second component having at least one electrical connection point on a surface of said second component, said second component being positioned in said second cavity such a first connection point of said second component corresponds to the location of a first termination pad of said second cavity.

3. The method of claim 2 further comprising repeating the steps, for a plurality of cavities and a plurality of passive electrical components, of:

forming a second cavity in said substrate, said second cavity having at least one electrical termination pad on a surface of said second cavity;

placing a second passive electrical component in said second cavity, said second component having at least one electrical connection point on a surface of said second component, said second component being positioned in said second cavity such a first connection point of said second component corresponds to the location of a first termination pad of said second cavity.

4. The method of claim 1 wherein said first and second electrical connection points on said first component are solder bumps.

5. The method of claim 1 wherein said electrically connecting said first component to said substrate and said semiconductor device comprises using controlled collapse chip connection technology.

6. The method of claim 1 wherein said first and second electrical connection points on said first component are located on opposing sides of said first component.

7. The method of claim 1 wherein said first cavity is a multilevel cavity adapted to hold a plurality of passive electrical components.

8. The method of claim 1 wherein said substrate includes a plurality of layers, said plurality of layers including at least one layer of internal circuitry used to interface said first component with at least one other electrical device.

9. The method of claim 1 further comprising electrically connecting said substrate to at least one passive electrical component mounted in at least one cavity formed in an electronic circuit board.

* * * * *